United States Patent
Song

(10) Patent No.: US 8,455,276 B2
(45) Date of Patent: Jun. 4, 2013

(54) LIGHT EMITTING ELEMENT AND A PRODUCTION METHOD THEREFOR

(75) Inventor: June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 155 days.

(21) Appl. No.: 12/991,090

(22) PCT Filed: May 4, 2009

(86) PCT No.: PCT/KR2009/002354
§ 371 (c)(1), (2), (4) Date: Feb. 23, 2011

(87) PCT Pub. No.: WO2009/136719
PCT Pub. Date: Nov. 12, 2009

(65) Prior Publication Data
US 2011/0133243 A1 Jun. 9, 2011

(30) Foreign Application Priority Data
May 5, 2008 (KR) .................. 10-2008-0041617

(51) Int. Cl.
*H01L 31/0232* (2006.01)

(52) U.S. Cl.
USPC .......... 438/29; 257/98; 257/99; 257/E33.063; 257/E33.067; 257/E33.068

(58) Field of Classification Search
USPC ....... 257/98, 99, E33.063, E33.067, E33.068; 438/29
See application file for complete search history.

(56) References Cited

U.S. PATENT DOCUMENTS

| | | | |
|---|---|---|---|
| 6,900,473 B2 | 5/2005 | Yoshitake et al. | |
| 6,992,331 B2 * | 1/2006 | Hon et al. | 257/79 |
| 7,244,957 B2 | 7/2007 | Nakajo et al. | |
| 7,541,206 B2 | 6/2009 | Yoon et al. | |
| 7,791,090 B2 * | 9/2010 | Lester et al. | 257/91 |
| 2004/0119082 A1 * | 6/2004 | Sugawara | 257/94 |
| 2005/0202581 A1 * | 9/2005 | Sugawara | 438/39 |
| 2006/0278888 A1 * | 12/2006 | Kim et al. | 257/103 |
| 2007/0194325 A1 * | 8/2007 | Sung et al. | 257/79 |
| 2008/0303053 A1 * | 12/2008 | Lester et al. | 257/103 |
| 2010/0276724 A1 * | 11/2010 | Yang et al. | 257/99 |
| 2011/0133242 A1 * | 6/2011 | Choi et al. | 257/99 |
| 2011/0291134 A1 * | 12/2011 | Kang | 257/98 |

FOREIGN PATENT DOCUMENTS

| | | |
|---|---|---|
| KR | 10-2006-0074387 | 7/2006 |
| WO | WO 2008082097 A1 * | 7/2008 |

OTHER PUBLICATIONS

International Search Report dated Dec. 28, 2009 for International Application No. PCT/KR2009/002354.

* cited by examiner

*Primary Examiner* — Allan R Wilson
(74) *Attorney, Agent, or Firm* — KED & Associates, LLP

(57) ABSTRACT

Disclosed are a light emitting device and a method of manufacturing the same. The light emitting device includes a growth substrate, a first conductive semiconductor layer on the growth substrate, an active layer on the first conductive semiconductor layer, a second conductive semiconductor layer on the active layer, and an ohmic contact layer having a concavo-convex structure on the second conductive semiconductor layer.

19 Claims, 3 Drawing Sheets

_US 8,455,276 B2_

LIGHT EMITTING ELEMENT AND A PRODUCTION METHOD THEREFOR

TECHNICAL FIELD

The present invention relates to a light emitting device and a method of manufacturing the same.

BACKGROUND ART

Recently, a light emitting diode (LED) is spotlighted as a light emitting device. Since the LED can convert electric energy into light energy with high efficiency and long life span of about 5 years or more, the LED can remarkably reduce the energy consumption and repair and maintenance cost. In this regard, the LED is spotlighted in the next-generation lighting field.

In the LED, a buffer layer is formed on a growth substrate including Si, SiC, or sapphire having a hexagonal crystal structure, and a light emitting semiconductor layer including a first conductive semiconductor layer, an active layer, and a second conductive semiconductor layer is formed on the buffer layer. The LED may include a group-III nitride single crystalline semiconductor, and the active layer emits light according to current applied through the first and second conductive semiconductor layers.

Meanwhile, in the LED, due to the difference in a refractive index between the light emitting semiconductor layers including a group III nitride-based semiconductor and air, the light emitted from the active layer is not extracted to the outside, but totally-reflected so that the light is extinguished inside the light emitting semiconductor layer.

Accordingly, in the LED, the light emitted from the active layer has to be extracted to the outside as much as possible to increase energy conversion efficiency (lm/W) of the LED.

DISCLOSURE

Technical Problem

The embodiment provides a light emitting device having a novel structure and a method of manufacturing the same.

The embodiment provides a light emitting device capable of improving light extraction efficiency and a method of manufacturing the same.

Technical Solution

According to the embodiment, a light emitting device includes a growth substrate, a first conductive semiconductor layer on the growth substrate, an active layer on the first conductive semiconductor layer, a second conductive semiconductor layer on the active layer, and an ohmic contact layer having a concavo-convex structure on the second conductive semiconductor layer.

According to the embodiment, a method of manufacturing a light emitting device includes preparing a first structure including a first conductive semiconductor layer, an active layer, a second conductive semiconductor layer, and an ohmic contact layer on a growth substrate, preparing a second structure including a sacrificial layer and a mask layer on a temporary substrate, forming a third structure by bonding the ohmic contact layer of the first structure to a mask layer of the second structure through a wafer bonding layer, removing the temporary substrate and the sacrificial layer from the third structure, forming a concavo-convex structure on a top surface of the mask layer by selectively removing the mask layer, and forming a concavo-convex structure on the ohmic contact layer by sequentially etching the mask layer having the concavo-convex structure, and the wafer bonding layer and the ohmic contact layer under the mask layer.

Advantageous Effects

The embodiment can provide a light emitting device having a novel structure and a method of manufacturing the same.

The embodiment can provide a light emitting device capable of improving light extraction efficiency and a method of manufacturing the same.

BEST MODE

Mode for Invention

Figure 1:
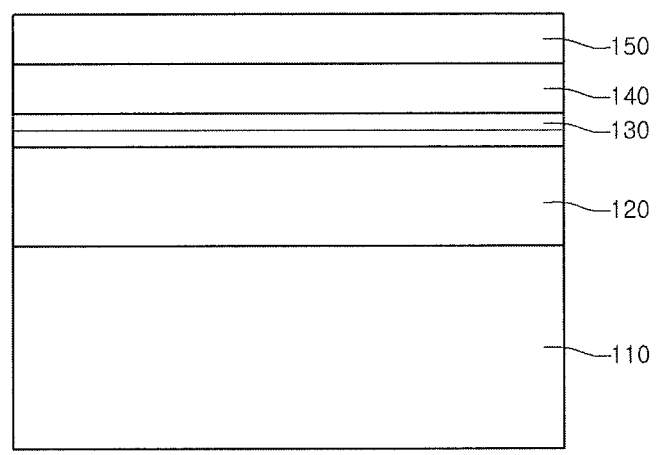
FIGS. 1 to 5 are sectional views showing a method of manufacturing a light emitting device according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIGS. 1 to 5 are sectional views showing a method of manufacturing a light emitting device according to the embodiment.

Referring to FIG. 1, after preparing a growth substrate 110, a light emitting semiconductor layer including a first conductive semiconductor layer 120, an active layer 130, and a second conductive semiconductor layer 140 is formed on the growth substrate 10, and an ohmic contact layer 150 is formed on the second conductive semiconductor layer 140.

The growth substrate 110 may include one selected from the group consisting of sapphire, SiC, ZnO, GaAs, GaN, Si, $LiAlO_2$, and $LiGaO_2$. For example, the growth substrate 110 may include a sapphire growth substrate.

The first conductive semiconductor layer 120 may include a nitride-based semiconductor layer including N type impurities. For example, the first conductive semiconductor layer 120 may include a GaN layer or an AlGaN layer doped with Si.

The active layer 130 may have a multi-quantum well structure. For example, the active layer 130 may include InGaN/GaN layers that are undoped.

The second conductive semiconductor layer 140 may include a nitride-based semiconductor layer including P type impurities. For example, the second conductive semiconductor layer 140 may include a GaN layer or an AlGaN layer doped with Mg.

Although not shown, a buffer layer including one selected from the group consisting of InGaN, AlN, SiC, SiCN, and GaN may be formed between, the growth substrate 110 and the first conductive semiconductor layer 120.

The ohmic contact layer 150 forms an ohmic contacting interface with respect to the second conductive semiconductor layer 140, so that current can be easily injected in a direction perpendicular to the second conductive semiconductor layer 140. The ohmic contact layer 150 has a low surface resistance, so that current can be easily spread in a horizontal direction.

In particular, the ohmic contact layer 150 may include a transparent material which can transmit light generated from the active layer 130. For example, the ohmic contact layer 150 may include one selected from the group consisting of ITO, IZO, ZnO, and NiO—Au.

Figure 2:
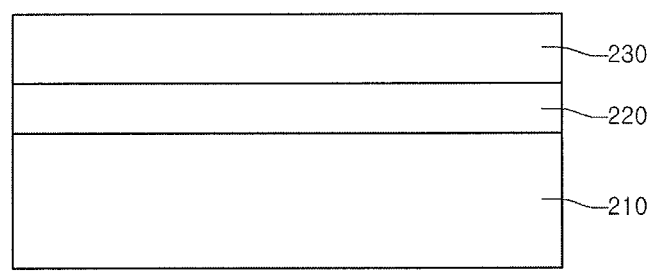

Referring to FIG. 2, after preparing a temporary substrate 210, a sacrificial separation layer 220 and a mask layer 230 are formed on the temporary substrate 210.

The temporary substrate 210 may include a material having 70% or more of light transmittance in a wavelength band of 500 nm or less or a material making thermal expansion coefficient difference of 2 ppm/D or less from the growth substrate 110. For example, the temporary substrate 210 may include one selected from the group consisting of $Al_2O_3$, SiC, GaN, InGaN, AlGaN, AlN, spinel, lithium niobate, neodymium gallate, and $Ga_2O_3$.

The sacrificial separation layer 220 includes a material proper to separate the temporary substrate 210. If the temporary substrate 210 is separated by irradiating a photon-beam having a specific wavelength band representing strong energy, the sacrificial separation layer 220 may include one selected from the group consisting of ZnO, GaN, InGaN, InN, ITO, AlInN, AlGaN, ZnInN, ZnGaN, and MgGaN. If the temporary substrate 210 is etched in a wet etching solution and separated, the sacrificial separation layer 220 may include one selected from the group consisting of Au, Ag, Pd, $SiO_2$, and $SiN_x$.

The mask layer 230 may include materials, such as group III nitrides including GaN or group II oxides include ZnO, having a transparent single hexagonal crystal structure. For example, the mask layer 230 may include one selected from the group consisting of GaN doped with Si, AlGaN doped with Si, InGaN doped with Si, GaN doped with Mg, AlGaN doped with Mg, InGaN doped with Mg, undoped ZnO, undoped MgZnO, doped ZnO, and doped MgZnO.

Figure 3:
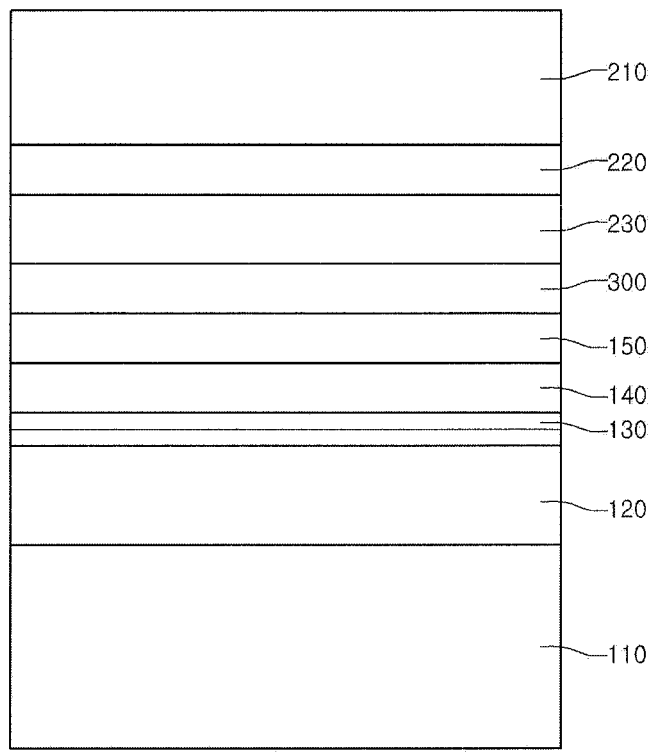

Referring to FIG. 3, the structure shown in FIG. 1 is bonded to the structure of FIG. 2 through a wafer bonding layer 300.

The wafer bonding layer 300 may include a material thin film representing a strong bonding strength under a condition of a predetermined pressure and a temperature of about 200□ or more. For example, the wafer bonding layer 300 may include one selected from the group consisting of Au, Ag, Al, Rh, Cu, Ni, Ti, Pd, Pt, Cr, Sn, In, Si, Ge, metallic silicide, $SiO_2$, $SiN_x$, SOG (spin on glass), ZnO, ZnS, photoresist, organics, and an adhesive.

Figure 4:
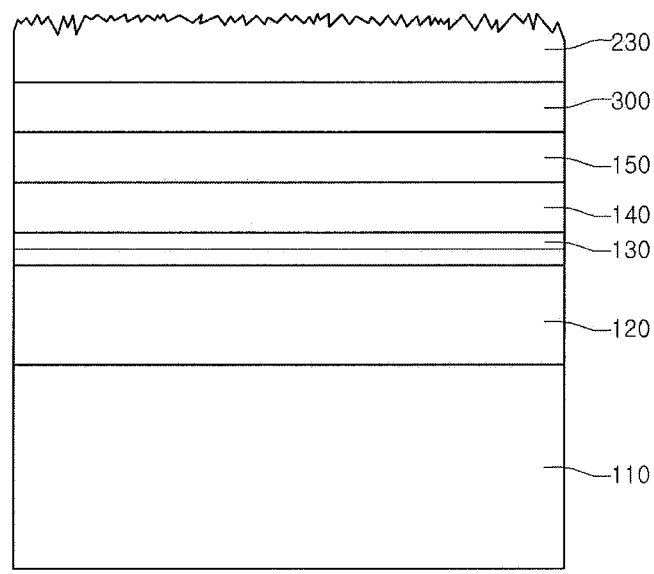

Referring to FIG. 4, the temporary substrate 210 and the sacrificial separation layer 220 are removed from the structure of FIG. 3, and a concavo-convex structure is formed on the mask layer 230.

The temporary substrate 210 may be removed through a chemical decomposition using a CMP (chemical-mechanical polishing) or a wet etching solution or thermo-chemical decomposition in which a photon-beam including a laser having strong energy is irradiated.

When the temporary substrate 210 is removed, the sacrificial separation layer 220 is simultaneously removed.

The concavo-convex structure of the mask layer 230 may be formed by selectively removing the mask layer 230 through a wet etching process using acid, base, or salt or a dry etching process using plasma. For example, if the mask layer 230 includes a GaN layer doped with Si, the concavo-convex structure may be formed by using a KOH solution.

Figure 5:
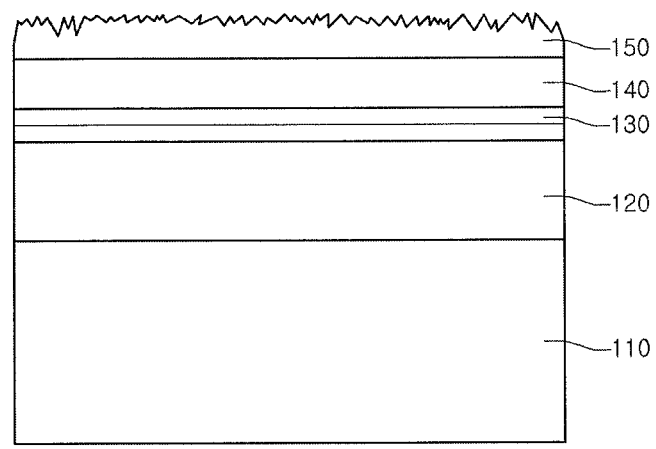

Referring to FIG. 5, the wafer bonding layer 300 and the ohmic contact layer 150 under the mask layer 230 are sequentially etched by using the mask layer 230 as a shadow mask. In this case, the etching process may include a wet etching process or a dry etching process Therefore, the concavo-convex structure formed on the mask layer 230 is shifted onto the top surface of the ohmic contact layer 150 through the etching process, so that the concavo-convex structure is formed on the top surface of the ohmic contact layer 150.

The concavo-convex structure is formed on the top surface of the ohmic contact layer 150, so that the light generated from the active layer 130 can be easily extracted to the outside through the concavo-convex structure of the ohmic contact layer 150.

Therefore, the light extraction efficiency of the light emitting device can be improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

INDUSTRIAL APPLICABILITY

The embodiment is applicable to a light emitting device used as a light source.

The invention claimed is:

1. A method of manufacturing a light emitting device, the method comprising:
preparing a first structure including a first conductive semiconductor layer, an active layer, a second conductive semiconductor layer, and an ohmic contact layer on a growth substrate;
preparing a second structure including a sacrificial layer and a mask layer on a temporary substrate;
forming a third structure by bonding the ohmic contact layer of the first structure to a mask layer of the second structure through a wafer bonding layer;
removing the temporary substrate and the sacrificial layer from the third structure;
forming a concavo-convex structure on a top surface of the mask layer by selectively removing the mask layer; and
forming a concavo-convex structure on the ohmic contact layer by sequentially etching the mask layer having the concavo-convex structure, and the wafer bonding layer and the ohmic contact layer under the mask layer.

2. The method of claim 1, wherein the temporary substrate includes one selected from the group consisting of $Al_2O_3$, SiC, GaN, InGaN, AlGaN, AlN, spinel, lithium niobate, neodymium gallate, and $Ga_2O_3$.

3. The method of claim 1, wherein the ohmic contact layer includes one selected from the group consisting of ITO, IZO, ZnO, and NiO—Au.

4. The method of claim 1, wherein the sacrificial layer includes one selected from the group consisting of ZnO, GaN, InGaN, InN, ITO, AlInN, AlGaN, ZnInN, ZnGaN, and MgGaN.

5. The method of claim 1, wherein the sacrificial layer includes one selected from the group consisting of Au, Ag, Pd, $SiO_2$, and $SiN_x$.

6. The method of claim 1, wherein the mask layer includes one selected from the group consisting of GaN doped with Si, AlGaN doped with Si, InGaN doped with Si, GaN doped with Mg, AlGaN doped with Mg, InGaN doped with Mg, undoped ZnO, undoped MgZnO, doped ZnO, and doped MgZnO.

7. The method of claim 1, wherein the wafer bonding layer includes one selected from the group consisting of Au, Ag, Al, Rh, Cu, Ni, Ti, Pd, Pt, Cr, Sn, In, Si, Ge, metallic silicide, $SiO_2$, $SiN_x$, SOG (spin on glass), ZnO, ZnS, photoresist, organics, and an adhesive.

8. The method of claim 1, wherein the growth substrate includes one selected from the group consisting of sapphire, SiC, ZnO, GaAs, GaN, Si, $LiAlO_2$, and $LiGaO_2$.

9. The method of claim 1, wherein the first conductive semiconductor layer includes a nitride-based semiconductor layer including N type impurities.

10. The method of claim 1, wherein the active layer has a multi-quantum well structure.

11. The method of claim 10, wherein the active layer includes InGaN/GaN layers that are undoped.

12. The method of claim 1, wherein the second conductive semiconductor layer includes a nitride-based semiconductor layer including P type impurities.

13. The method of claim 12, wherein the second conductive semiconductor layer includes a GaN layer or an AlGaN layer doped with Mg.

14. The method of claim 1, wherein the temporary substrate includes a material having 70% or more of light transmittance in a wavelength band of 500 nm or less.

15. The method of claim 1, wherein the temporary substrate includes a material making thermal expansion coefficient difference of 2 ppm/° C. or less from the growth substrate.

16. The method of claim 1, wherein etching the mask layer, the wafer bonding layer and the ohmic contact layer includes a wet etching process using acid, base, or salt.

17. The method of claim 1, wherein etching the mask layer, the wafer bonding layer and the ohmic contact layer includes a dry etching process using plasma.

18. The method of claim 1, wherein the temporary substrate is removed through a chemical decomposition using a chemical-mechanical polishing (CMP) or a wet etching solution or thermo-chemical decomposition based on a photon-beam from a laser.

19. A method of providing a light emitting device, the method comprising:
 providing a first structure that includes a first conductive semiconductor layer, an active layer, a second conductive semiconductor layer, and an ohmic contact layer on a growth substrate, the active layer having a multi-quantum well structure, wherein the first conductive semiconductor layer includes a nitride-based semiconductor layer including N type impurities, wherein the second conductive semiconductor layer includes a nitride-based semiconductor layer including P type impurities;
 providing a second structure that includes a sacrificial layer and a mask layer on a temporary substrate;
 providing a third structure by bonding the ohmic contact layer of the first structure to a mask layer of the second structure through a wafer bonding layer;
 removing the temporary substrate and the sacrificial layer from the third structure;
 providing a concavo-convex structure on a top surface of the mask layer by selectively removing the mask layer; and
 providing a concavo-convex structure on the ohmic contact layer by sequentially etching the mask layer having the concavo-convex structure, and the wafer bonding layer and the ohmic contact layer under the mask layer.

\* \* \* \* \*